(12) United States Patent
Hu (10) Patent No.: US 8,921,683 B2
(45) Date of Patent: Dec. 30, 2014

(54) COMBINED SOLAR/THERMAL (CHP) HEAT AND POWER FOR RESIDENTIAL AND INDUSTRIAL BUILDINGS

(75) Inventor: Haoran Hu, Novi, MI (US)

(73) Assignee: Eaton Corporation, Cleveland, OH (US)

( * ) Notice: Subject to any disclaimer, the term of this patent is extended or adjusted under 35 U.S.C. 154(b) by 659 days.

(21) Appl. No.: 13/127,415

(22) PCT Filed: Nov. 4, 2009

(86) PCT No.: PCT/US2009/063288
§ 371 (c)(1),
(2), (4) Date: May 3, 2011

(87) PCT Pub. No.: WO2010/053997
PCT Pub. Date: May 14, 2010

(65) Prior Publication Data
US 2011/0209744 A1 Sep. 1, 2011

Related U.S. Application Data

(60) Provisional application No. 61/198,256, filed on Nov. 4, 2008.

(51) Int. Cl.
*H01L 31/058* (2006.01)
*H01L 35/26* (2006.01)
*H01L 35/30* (2006.01)
*H01L 35/22* (2006.01)
*H02S 10/10* (2014.01)
*H01L 31/052* (2014.01)

(52) U.S. Cl.
CPC .............. *H01L 35/30* (2013.01); *H01L 35/26* (2013.01); *Y02B 10/20* (2013.01); *Y02B 10/10* (2013.01); *Y02E 10/50* (2013.01); *H01L 31/0522* (2013.01); *Y02B 10/70* (2013.01); *H01L 35/22* (2013.01); *H01L 31/0583* (2013.01)
USPC ........... 136/248; 136/200; 136/204; 136/205; 136/206; 136/212

(58) Field of Classification Search
CPC ..... H01L 31/0583; H01L 35/22; H01L 35/26; H01L 35/30; H01L 35/0522; Y02E 10/50
USPC ......................................................... 136/248
See application file for complete search history.

(56) References Cited

U.S. PATENT DOCUMENTS 2,984,696 A 5/1961 Shaffer
3,956,017 A 5/1976 Shigemasa (Continued)

OTHER PUBLICATIONS

Y. Tripanagnostopoulos and M. Tripanagnostopoulos, Design aspects and perspectives for solar control of buildings with aesthetic and efficient solar thermal collectors and photovoltaics, 2nd PALENC Conference and 28th AIVC Conference on Building Low Energy Cooling and Advanced Ventilation Technologies in the 21st Century, Sep. 2007, Crete island, Greece, pp. 1052-1056.

(Continued)

*Primary Examiner* — Matthew Martin
(74) *Attorney, Agent, or Firm* — Paul V. Keller, PLC (57) ABSTRACT

A solar powered generator (100) has thermoelectric elements adjacent to and below solar cells. Concentrated sunlight is provided. A heat sink (104), which can be variable in temperature or efficiency, is in contact with the cold junction (108) of the thermoelectric device (103). The thermal resistivity is designed in relation to the energy flux, whereby the thermoelectric device (103) develops a gradient of several hundred Kelvin. Preferably the solar cell comprises a high band gap energy semi-conductor. The generator (100) maintains relatively consistent efficiency over a range of cold junction (108) temperatures. The heat sink (104) can be a hot water system. High efficiencies are achieved using nanocomposite thermoelectric materials. Evenly but thinly dispersing the thermoelectric segments in a matrix of highly insulating material reduces the amount of material required for the segments without sacrificing performance. A unitary construction of the solar cell and thermoelectric elements provides further advantages.

15 Claims, 6 Drawing Sheets

(56) References Cited

U.S. PATENT DOCUMENTS

| | | | |
|---|---|---|---|
| 4,002,031 A | 1/1977 | Bell | |
| 4,106,952 A * | 8/1978 | Kravitz | 136/206 |
| 4,235,221 A | 11/1980 | Murphy | |
| 4,350,144 A * | 9/1982 | Beckwith | 126/586 |
| 4,500,741 A | 2/1985 | Morimoto et al. | |
| 4,640,977 A | 2/1987 | Shakun | |
| 4,710,588 A | 12/1987 | Ellion | |
| 5,385,615 A | 1/1995 | Horne | |
| 5,518,554 A | 5/1996 | Newman | |
| 5,851,310 A | 12/1998 | Freundlich et al. | |
| 5,936,193 A | 8/1999 | Parise | |
| 6,147,296 A | 11/2000 | Freundlich | |
| 6,372,980 B1 | 4/2002 | Freundlich | |
| 6,444,896 B1 | 9/2002 | Harman et al. | |
| 6,489,704 B1 | 12/2002 | Kucherov et al. | |
| 6,670,544 B2 | 12/2003 | Kibbel et al. | |
| 7,148,417 B1 | 12/2006 | Landis | |
| 2003/0041894 A1 * | 3/2003 | Sverdrup et al. | 136/251 |
| 2003/0221717 A1 | 12/2003 | Dessel | |
| 2004/0055631 A1 | 3/2004 | Szymocha et al. | |
| 2004/0187908 A1 * | 9/2004 | Muhs et al. | 136/246 |
| 2006/0118158 A1 * | 6/2006 | Zhang et al. | 136/205 |
| 2006/0225782 A1 | 10/2006 | Berke et al. | |
| 2006/0243317 A1 * | 11/2006 | Venkatasubramanian | 136/206 |
| 2007/0251569 A1 * | 11/2007 | Shan et al. | 136/246 |
| 2008/0128021 A1 | 6/2008 | Choudhury et al. | |
| 2008/0202575 A1 | 8/2008 | Ren et al. | |
| 2009/0068465 A1 | 3/2009 | Chen et al. | |

OTHER PUBLICATIONS

G. Landis, D. Merritt, R. Raffaelle, D.. Scheiman, High-Temperature Solar Cell Development, NASA/CP—2005-213431, pp. 241-247.

A.J. Nozik, Quantum Dot Solar Cells, NREL/cp-590-31011 (Oct. 2001).

T. Caillat, Novel High Efficiency Segmented Thermoelectric Unicouples for Space and Terrestrial Applications, 22nd International conference on Thermoelectrics, Aug. 17-21, 2003.

Xiaofen Giu, Nanostructured Materials for Energy Conversion, Case Western Reserve University, Thesis (May 2008).

* cited by examiner

COMBINED SOLAR/THERMAL (CHP) HEAT AND POWER FOR RESIDENTIAL AND INDUSTRIAL BUILDINGS

PRIORITY

This application is a continuation-in-part of U.S. Provisional Application No. 61/198,256, filed Nov. 4, 2008, the contents of which are incorporated herein by reference.

FIELD OF THE INVENTION

The present invention relates to solar powered devices and methods of converting solar power into useful forms of energy.

BACKGROUND

There is a long recognized and continuing need for cost effective renewable energy sources. With this goal, significant efforts have been made to develop cost effective solar powered generators to harvest solar energy. The main focus of these efforts have been to make high efficiency low cost solar panels.

Solar panels are photovoltaic devices designed to convert solar energy directly to electricity. Basic solar panel technology is based on p-n junctions. The difference in charge carrier concentration between p- and n-doped regions of a semiconductor material cause charge carriers to diffuse, thereby creating a static electric field within the semiconductor. The semiconductor has a band gap energy which is the energy difference between the minimum of its conduction band maximum of its valence band. Many semiconductors the band gap energy that lies within limits of the solar radiation spectrum. Photons with energy greater than the band gap energy can be absorbed by the semiconductor and raise charge carriers from its valance band to its conduction band. The excited carriers flow as a result of the electric field and provide electrical power.

Solar panels in current use can be broadly divided into crystalline silicon and thin film technologies. Crystalline silicon is a relatively poor absorber of light and requires a comparatively large thickness (several hundred microns) of material in comparison to materials such as Cadmium Telluride (CdTe) and Gallium Arsenide (GaAs) used in thin film technologies. Presently, crystalline silicon solar panels provide higher efficiencies than thin film solar panel, but are more expensive to make. Good conversion efficiencies for solar panels commercially available at this time are in the range from 14-19%. Higher conversion efficiencies are possible.

A maximum efficiency for converting un-concentrated solar radiation into electrical energy using a single junction solar panel at room temperature is about 31% according to the well known Shockley-Queissar limit. This limit takes into account a thermodynamically unavoidable rate of carrier recombination and a mismatch between the band gap energy of the semiconductor and the solar energy spectrum.

The mismatch relates to the quantization of energy in light. Wavelengths of light with energy below the band gap energy cannot excite charge carriers. Wavelengths of light with energy above the band gap energy can excite carriers, but the energy in excess of the band gap energy is rapidly converted to heat. Band gap energies around 1.3 eV provide the highest theoretical efficiency for a single-junction solar panel at room temperature.

The Shockley-Queissar limit for a single-junction solar panel can be exceeded by providing multiple junctions. A typical multi-junction solar panel comprises a layered stack of two or more semiconductor materials having different band-gap energies. The uppermost layer has the highest band gap energy. Ideally, the uppermost layer absorbs the portion of the spectrum with energy equal to or greater than the upper layer's band gap energy while passing longer wavelengths for use by the layers beneath.

Optical transparency for the layered structure generally requires that all layers have similar crystal structure and lattice constants. A lattice constant describes the spacing of the atom locations in a crystal structure. Mismatch in the lattice constants between different layers tends to creates dislocations and significantly deteriorates the efficiency of a multi-junction solar panel.

While the choice of materials for multi-junction solar panels is constrained, many suitable combination have been found and shown to outperform single junction cells. By suitably dividing the absorption spectrum, excellent results have been obtained with two, three, and four junction cells. For example, a two junction cell comprising InGaP (1.9 eV) and GaAs (1.4 eV) held a record efficiency near 30% in the 1990's. A three junction cells comprising GaInP (1.85 eV), GaAs-layer (1.42 eV) and Ge (0.67 eV) has been used to demonstrate efficiencies near 40%.

Another way to improve solar panel efficiencies is by concentrating sunlight onto the solar panel surface. Aside from the obvious benefit of providing more light per unit area, the direct light provided by a concentrator (as compared to the diffuse light received by a panel directly exposed to the sun) allows for a higher efficiency. 41% is the theoretical limit for a single junction cell and 55% for a two junction cell. For direct sunlight, the optimal bandgap energy at room temperature is 1.1 eV. For a two junction cell in the standard series configuration, a 0.77 eV, 1.55 eV pairing is the approximate optimum. For three junctions, 0.61 eV, 1.15 eV, and 1.82 eV approximates the ideal as reported by M. A. Green in. *Third-Generation Photovoltaics: Advanced Solar Energy Conversion*, pp 60-63 (Springer: Heidelberg, 2003).

A further improvement to enhancing the electrical conversion efficiency involves deriving electrical energy from the excess energy absorbed when an electron is excited by a photon with energy in excess of the band gap energy. Initially, this energy is retained by the carriers, resulting in "hot carriers". There are two fundamental ways to use the hot carriers for enhancing the efficiency of electrical energy production. One way produces an enhanced voltage and the other produces an enhanced current. The former requires that the carriers be extracted before they cool, while the latter requires that hot carriers having sufficient energy to produce a second electron-hole pair through impact ionization. For either process to be effective, it must be carried out at a rate competitive with the rate of carrier cooling, which is itself very fast.

The rate of carrier cooling can be greatly reduced by producing the carriers within a nanocomposite material that alters the relaxation dynamics through quantum effects. Nanocomposite materials include quantum wells, quantum wires, and quantum dots. These structures confine the carriers to regions of space that are smaller than or comparable to the carrier's deBroglie wavelength or to the Bohr radius of excitons in the semiconductor bulk. Quantum dots are most effective in this regard.

Quantum dots consisting of very small crystals of one semiconductor (e.g. Indium Gallium Arsenide) within a matrix of another semi-conductor (e.g., Gallium Arsenide) can slow carrier cooling to the point where impact ionization becomes significant. Impact ionization when a hot carrier gives up some of its energy to excite a second carrier from the valence band to the conduction band while itself retains sufficient energy to remain in the conduction band. Impact ionization can also be achieved by quantum dots consisting of very small semiconductor crystals dispersed in an organic semiconductor polymer matrix.

Hot carrier extraction can be achieved by ordering the quantum dots in closely spaced three-dimensional array with sufficiently close spacing for strong electronic coupling and the formation of mini-bands to occur. The mini-bands allow long-range electron transport. The mini-bands provide fast enough transport for the hot carrier current to be drawn off at a potential above the normal conduction band potential. To understand this mechanism, it may help to note that the hot carrier energy spreads among all the carriers in the conduction band on a shorter time scale than the timescale on which the energy spreads towards thermal equilibrium in other ways. Thus the entire carrier stream is "hot".

To avoid confusion with the above mechanisms, it is worth noting there is another use for quantum wells in enhancing solar panel efficiencies. Quantum wells can be used to adjust and finely tune the band gap energies of the semi-conductors into which they are incorporated. This allow semi-conductor band gap energies to be adapted to better match the solar spectrum and provides flexibility in selecting materials.

Still further, nanocrystals within a semiconductor composite have highly size dependent band gap energies. These can be used to make available to charge carriers energy states intermediate the valance and conduction bands of the matrix materials. These intermediate bands allow the composite to achieve electrical conversion of photons with energy below the band gap energies of the matrix semiconductors through a two step process of exciting charges from a valance band to the intermediate bands and from the intermediate bands to a conduction band.

Many of the foregoing structural enhancements are only economical in conjunction with solar concentration. Commercially available solar concentrators provide solar energy with concentrations of 500. While such high concentration justifies the use of highly engineered semiconductor materials it introduces the problem of managing intense heat. Heating is very detrimental to solar panel performance.

The theoretical maximum efficiencies quoted above all diminish with increasing temperatures. All solar panels undergo diminishing efficiency with increasing temperature. According to the National Aeronautics and Space Administration (NASA), as reported in U.S. Pat. No. 7,148,417, a typical silicon solar panel loses about 0.45% power per degree centigrade of increasing temperature. Above 250° C., silicon solar panels produce essentially no power. GaAs solar panels fare somewhat better, losing only about 0.21% power per degree Celsius. Multi-junction thin film solar panels generally fared even worse because the layer thickness are generally carefully matched to equalize currents produced by each layer. Even a 5% mismatch can severely disrupt the multi-Junction solar panel's operation. M. A. Green in *Third-Generation Photovoltaics: Advanced Solar Energy Conversion*, p, 63 (Springer: Heidelberg, 2003). The routine solution of this problem is to provide cooling.

Solar panels have been used to provide hot water for domestic use in addition to electricity. As noted by U.S. Pat. No. 2004/0055631, using the solar panel in this manner requires operating the solar panel at a temperature of at least about 60° C., which significantly compromises the cell's electrical production efficiency. The solution proposed by that application is make the solar panel to a portion of the solar energy spectrum with energy below a semiconductor's band-gap energy. The solar panel is insulated from the heating elements, which utilize a portion of the solar energy spectrum that could not be converted to solar panel. The solution is said to be more space efficient than the alternative of using separate solar energy collectors for electricity production and water heating. Another way to go generate hot water is to draw heat from the solar collection system. When high degrees of solar concentration are used, the waste heat can be considerable.

SUMMARY

The invention provides solar powered generators and associated methods. One aspect of the invention is a solar powered generator comprising a solar panel and a thermoelectric device adjacent to and below the solar panel. The hot junction of the thermoelectric device is in close thermal coupling with the bottom side of the solar panel. A heat sink is placed in contact with the cold junction of the thermoelectric device to cool it. The thermoelectric device has n- and p-type legs that comprise one or more segments of doped semi-conductor material. At least one of the segments is formed of a nano-composite material in which quantum confinement of carriers substantially reduces the segment's thermal conductivity.

In general, it is not desirable to place a thermoelectric device in between a solar panel and a heat sink. It is both simpler and more energy-efficient to cool the solar panel directly. The present invention creates an exception to the general rule. In the first place, the invention mitigates the energy conversion efficiency loss introduced by the thermoelectric device by using recently developed materials for the thermoelectric device that greatly enhance the performance of such devices. Second, the inventor recognizes that in some situations an adequate heat sink to maintain the solar panel at a desired temperature cannot be provided in a practical manner. In those situations, a large degree of heating may be unavoidable. Where the only available heat sink is inadequate to effectively maintain the temperature of a solar panel within a narrow operating temperature range, the present invention can perform better because the thermoelectric device can keep the solar electric conversion efficiency high even as the solar generator heats up due to underperformance of the heat sink. The invention is also useful in that the solar panel can provide cold start performance for what is essentially a solar heat-powered thermoelectric generator.

In a method according to the invention, a solar panel is configured to receive concentrated sunlight and a thermoelectric device is configured to draw heat from the solar panel and transfer it to a heat sink. At dawn and other times when there has not been much sunshine, the solar panel produces more power than the thermoelectric device. On sunny days, the solar panel is allowed to heat to a large degree. As the solar panel heats, it produces progressively less electricity while the thermoelectric device produces progressively more electricity. The solar panel is allowed to heat to a high temperatures. The solar panel can be allowed to reach temperatures at which the thermoelectric device is the dominant mode of electricity generation.

Another aspect of the invention is a solar powered generator comprising a photovoltaic device and a thermoelectric device of unitary construction. Either the photovoltaic device comprises layers of semiconductor material grown on components of the thermoelectric device or the thermoelectric device comprises layers of semiconductor material grown on components of the photovoltaic device. This unitary construction reduces material requirements and enables the hot junction of the thermoelectric device to heat quickly to temperatures at which thermoelectric energy conversion is efficient.

A further aspect of the invention also relates to a solar powered generator comprising a photovoltaic device and the thermoelectric device wherein the thermoelectric device is adjacent to and below the solar panel with the hot junction in close thermal coupling with the bottom side of the solar panel. The thermoelectric device has n- and p-type legs that comprise one or more segments of doped semi-conductor material. The thermoelectric device is conformal with the surface of the solar panel and spans approximately the same area. The legs of the thermoelectric device are thinly dispersed in a matrix of highly thermally insulating material selected from the group consisting of vacuum, gas, and an aerogel. The legs occupy less than 10% of the cross-sectional area and the insulation occupies more than 90%. This configuration greatly reduces the amount of semiconductor material required for the legs, which is particularly important if nano-composite materials are used. Because the legs are evenly dispersed with respect to the solar panel surface, very small, and closely spaced, and because the legs are very short, the legs effectively cool the solar panel in spite of their low spatial density and low thermal conductivity.

The primary purpose of this summary is to present some major concepts of the present disclosure in a simplified manner that will facilitate understanding of the more detailed description and claims that follow. This summary cannot be comprehensive and cover every idea and detail that may be considered inventive or serve to delineate that which is inventive. Other ideas and details and ways of generalizing and applying the foregoing concepts will be conveyed by the following description, the drawings, and this disclosure as a whole. The ultimate statement of what the inventor is claiming is reserved for the claims that follow. Those claims may be amended through the ordinary course of patent prosecution.

BRIEF DESCRIPTION OF THE DRAWINGS

The accompanying drawings use reference numbers according to certain conventions. Identical reference numbers appearing in different figures indicate the same element is being shown in different positions, uses, or perspectives. Where the two reference numbers are different but identical in their two least significant digits, a relationship is still indicated: the referenced objects are related as being of the same genus or related as species and genus. The drawings themselves and the context of the description will clarify which relationships apply and whether remarks about one element are equally applicable to related elements. Trailing letters are used to distinguish repeated elements within a single drawing or example.

DETAILED DESCRIPTION

Figure 1:
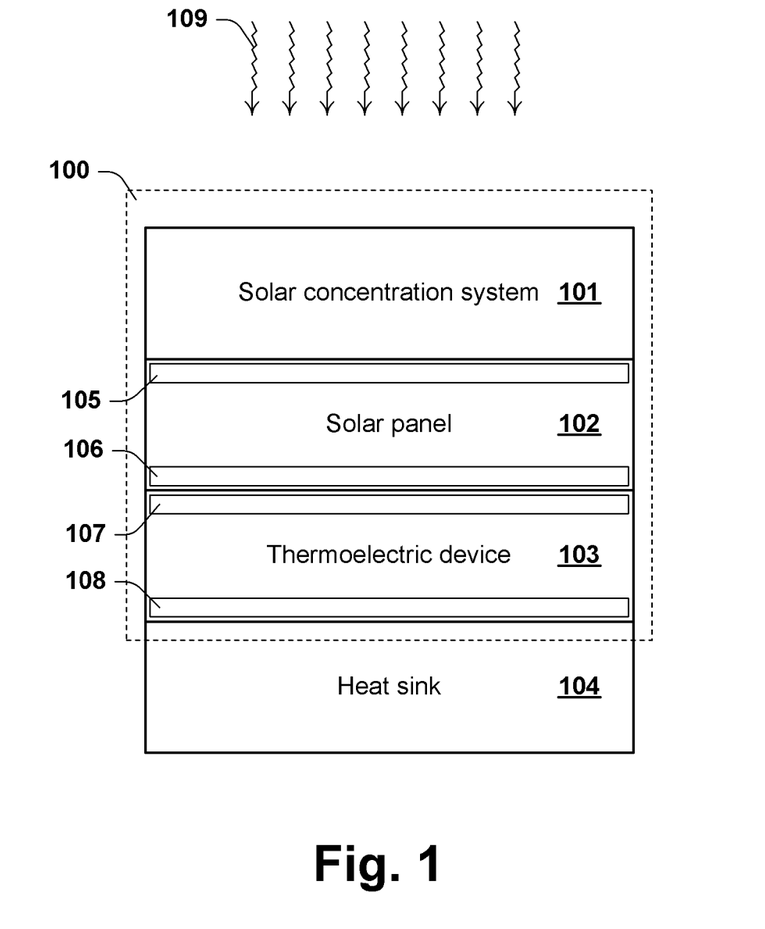
FIG. 1 is a schematic illustration of an exemplary solar powered generator 100 operating with heat sink and sunlight.

FIG. 1 provides a schematic illustration of an exemplary solar powered generator 100 that produces electricity from sunlight 109. The solar powered generator 100 comprises an optional solar concentration system 101, a solar panel 102, and a thermoelectric device 103. The generator 100 requires a heat sink 104 to operate. The heat sink 104 may be provided as part of the solar powered generator 100. The generator 100 produces power from both the solar panel 102 and the thermoelectric device 103. These sources are generally brought to the same voltage, combined, and coupled to a load.

The solar concentration system 101 can be any suitable device that functions to concentrate sunlight. The solar concentration system 101 can provide a low, medium, or large degree of solar concentration. A low degree would be a concentration factor, f, in the range from about 2 to about 10. A medium degree of concentration would be in the range from about 10 to about 100. A concentration factor over 100 would be considered high. In the absence of solar concentration, f is 1.

Solar radiation is incident upon the earth's surface with a concentration that peaks at about 1.3 kW/m². This value is sometimes used as unit of solar energy flux density "1 sun". A solar concentration system 101 with a concentration factor, f, illuminates the upper surface 105 of the solar panel 102 with an energy densities peaking at about f*1.3 kW/m² (f suns). The actual concentration of sunlight provided by the solar concentration system 101 at any given time may vary according to factors such as the position of the sun in the sky, but every solar concentration system can be expected to have a fairly well-defined maximum concentration factor representing its capability and a maximum intensity of sunlight it can be expected to deliver.

Solar concentration can be achieved with arrangements of reflective mirrors and/or refractive lenses. The preference here is for the simplest systems that still provide high solar concentration. Spectrum splitting is not required. The solar concentration system 101 may comprise a solar tracker to adjust positioning to keep focus as the sun moves. The solar concentration system 101 may have a cooling system to keep its components from heating excessively under intense light. The system 101 may comprise a bundle of optical fibers, whereby the solar concentration system 101 can be positioned remotely from the other components of the solar powered generator 100. In this regard, it should be appreciated that references to a "top" and "bottom" of the solar panel 102 are not meant as limitations on where the panel is positioned. The system 101 may comprise a mirror chamber or similar elements to re-reflect light reflected from the surface 105 or emitted from the solar panel 102.

The solar panel 102 may, and generally does comprise, a plurality of individual solar cells connected in series or parallel. Solar cells are photovoltaic devices suitable for generating electricity from solar radiation. A solar panel may be comprise an array of smaller solar panels. The solar panel 102 can be of such a type, provide each of the smaller panels has a thermoelectric device 103. The relationship between the solar panel 102 and the thermoelectric device 103, in terms of their adjacency and heat transfer, would be repeated for each separate element of the array. A unitary construction of the solar panel 102 and the thermoelectric device 103 would then be understood to mean unitary with respect to each element in the array.

The solar panel 102 (or each unit in the array) is thin, giving it just two major sides. These may be referred to as front and back or top and bottom. The front or top surface 105 is the one faced to the light. The top surface 105 and the bottom surface 106 are substantially conformal, notwithstanding any protrusions. They have approximately equal gross surface areas.

The solar panel 102 can comprise any type of photovoltaic cell suitable for the environment of use. The examples discussed in the background section are applicable in a broad sense, although adaptations for photovoltaic functioning at high temperature are preferred. The need for high temperature durability and the ability to withstand thermal cycling also narrows the practical choices. The solar powered generator 100 is designed with the intention that solar energy will heat the solar panel 102 to high temperatures, such as 475 K, 575 K, 675 K, or higher. The development of high temperatures is encouraged to provide a source of high temperature heat for the thermoelectric device 103.

The solar panel 102 is preferably adapted for photovoltaic performance at high temperatures. Solar panels adapted for operation only under ambient conditions include bulk single crystal silicon solar panels and commercially available serially connected multi-junction thin film solar panels. Either type rapidly loses efficiency with increasing temperatures.

Adapting the solar panel 102 for high temperature operation generally comprises selecting high band gap energy semiconductors materials. GaN (3.2 eV), SiC, GaP (2.26 eV) are examples of semiconductors with high band gap energies that can be used to form high temperature-adapted solar cells. Temperature sensitive designs, such as the common serial multi-junction design, are either avoided or tuned to a very high temperature.

A solar panel 102 adapted for high temperature performance comprises at least one semiconductor junction, uppermost in a layered configuration, having a band gap energy higher than would be selected for operation at ambient temperatures. Higher band gap energy semiconductors utilize less of the solar spectrum than lower band gap energy semiconductors, however, higher band gap energy semiconductors lose less of their efficiency with increasing temperatures than lower band gap energy semiconductors. High band gap energy solar cells sacrifice room temperature performance in order to retain more performance at high temperatures.

The optimum band-gap energies referred to in the background section are not those most preferable for the present application. The ideal band gap energy is application dependent, but a suitable selection can be made based on theory or experiment. In a single junction solar panel, a band gap energy greater than 1.6 would indicate adaptation to high temperature use and above 1.8 eV more definitely so. In a dual junction device an upper layer bandgap energy of 2.0 eV is indicative, with 2.2 eV being even more so.

A single-junction GaAs single crystal or thin film solar panel is better suited to high temperature operation than most solar panels, but is not adapted to high temperature operation. The GaAs band gap energy (1.4 eV) is high in comparison to that of silicon, making it less temperature sensitive than silicon. As the terms will be used in this disclosure, GaAs is adapted to medium temperature operation, but not to high temperature operation.

In the present disclosure a high temperature is at least 475 K. Operation with the temperature of the solar panel 102 peaking in excess of 675 Kelvin is typical for a solar powered generator 100 in order to facilitate electricity generation through the thermoelectric device 103. Adaptation to operation at such high temperatures does not mean that the solar panel 102 will not have diminished performance at 475 Kelvin in comparison to performance at an ambient temperature of 300 Kelvin. Almost any (or every) solar panel will experienced a diminution in efficiency with increasing temperature. Adaptation to high temperatures comprises sacrificing performance at ambient temperatures to improve performance at high temperatures.

A good indication of high temperature adaptation in a serially connected multi-junction solar panel is the relative current output of the various junctions as a function of temperature. The junctions are usually connected in series and current matched. Current matching comprises adjusting the junction layer thicknesses until each junction produces nearly the same current. When the currents are not matched, the result is highly detrimental to performance. Because the degree to which temperature affects current varies widely among the different junctions used in multilayer devices, current matching must be done for a particular temperature. The temperature at which each layer produces the same amount of current under solar illumination is the temperature at which the solar panel is adapted to operate. These comments about current matching apply to serially connected multi-junction devices. The need for current matching can be avoided by parallel connection. Parallel connection is generally not used in multilayer solar panels because of the complexity of the structures its implementation requires. A compromise for the present application would be to use parallel connection but limit the maximum number of junctions to two.

The solar panel 102 has a low resistivity to transferring heat through its thickness in comparison to the thermoelectric device 103. If the solar panel 102 is overly thick or has an inadequate thermal conductivity for its thickness, a significant temperature gradient develops between its top surface 105 and its bottom surface 106. Some temperature gradient is necessary for transmitting heat to the thermoelectric device 103, but in a prefer design this gradient will be very small. A large gradient would not reduce steady state energy production by the thermoelectric device 103, but it would result in unnecessarily high temperatures in the solar panel 102.

Depending on the degree of solar concentration used by the solar powered generator 100, it may be important to consider thermal resistivity in designing the solar panel 102. At low solar concentrations, ordinary materials are likely to be adequate although care should be taken that substrates and backing materials provided with the solar panel 102 do not introduce excessively with thermal resistivity.

A low heat capacity for the solar panel 102 is generally advantageous, but there are advantage in having a high heat capacity. A high heat capacity reduces temperature fluctuations and rates of temperature change, which reduces stress on materials and enhances durability. Beyond the durability concern, which may define a minimum required heat capacity, the considerations are more complex.

The advantages of a high heat capacity, such as a metal plate might provide without introducing excessive thermal resistivity, include temperature stability and more photoelectric energy production at low temperatures. While high heat capacity means that both high and low temperatures take longer to go away, transients associated with going from low to high temperature correspond to the availability of light whereas transients associated with going from high to low temperatures are associated with sunlight having been lost.

The net result is more light on average at low temperatures and less light on average at high temperatures. If the solar panel 102 were the only consideration, high heat capacity would be beneficial.

The considerations are reversed for the thermoelectric device 103. The thermoelectric device 103 provides the most efficiency when the solar panel 102 has arrived at steady state maximum temperature. If all these components rapidly reach that condition when the sun comes out, energy production from the thermoelectric device 103 will be maximized. If the warm-up period is long, much heat will be transferred through the thermoelectric device 103 at a lower temperature differential, and thus with a lower thermoelectric conversion efficiency. Likewise heat stored by the solar panel 102 will be transferred during cool down rather than while the temperature differential is still at its maximum.

Given the foregoing considerations, the heat capacity in and around the solar panel 102 is a matter involving several consideration, which are independent with other design choices. Adaptations for either lowering or increasing heat capacity may be warranted according to the application.

Increased heat capacity can be provided at the interface between the solar panel 102 and the thermoelectric device 103 or above the surface 105. A transparent cover over the surface 105 having good thermal contact with the surface 105 would be preferred for the advantage of not increasing thermal resistivity between the solar panel 102 and the thermoelectric device 103, but that advantage must weighed against any loss in photoelectric generation due to light absorption by this covering layer.

Any structure that does not excessively interfere with heat transport between the solar panel 102 and the hot junction 107 can be used to provide additional heat capacity, if such additional heat capacity is desired. Suitable structures include metal layers. Metals have a favorable combination of high heat capacity and high thermal conductivity.

A thermoelectric device as the term is used herein is a device comprising a hot junction and a cold junction and functional to generate electricity directly from thermal energy when the hot junction is held to a temperature above that of the cold junction. The thermoelectric device 103 comprises p and n-doped semiconductor regions. Charge carrier concentrations within these regions depend on temperature. When a temperature gradient is applied from the hot junction 107 to the cold junction 108, the temperature gradient traverses these regions and thereby creates charge carrier gradients. The charge carrier gradients result in a flow of electricity.

Figure 3:
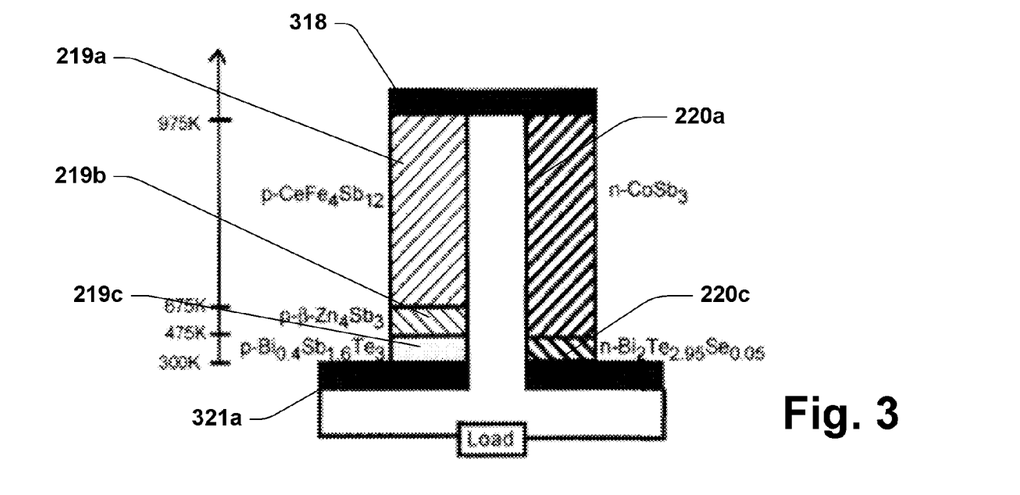
FIG. 3 is a schematic that illustrates segmenting in the design of a thermoelectric device.

FIG. 3 provides an example 203 for the thermoelectric device 103. The thermoelectric device 203 comprises p-leg 219, which comprises at least one n-doped semiconductor segment, and n-leg 220, which comprises at least one segment of a n-doped semiconductor region. The legs 219 and 220 span a gap between a hot junction 207 and a cold junction 208. Electrical insulation 222 isolates the legs. Metal interconnects 218 are provided adjacent or within the hot junction 207. Ohmic contacts are connect each of the legs 219 and 220 to the metal of interconnect 218, whereby the p-leg 219, the metal interconnect 218, and the n-leg 220 provide a p-i-n junction. The p-i-n junction creates electric fields through legs 219 and 220. At the cold junction 208, the legs 219 and 220 have ohmic contacts with leads 221a and 221b. These leads are electrically isolated from one another although they may be part of a single metal interconnect layer, an interconnect layer being a pattern of metal in a planar matrix of dielectric.

When the hot junction 207 is maintained at a higher temperature than the cold junction 208, charge carrier gradients form in the legs causing electrons to flow down the p-leg 219 and holes (effectively) down the n-leg 220. The potential difference between the leads varies depending on the temperature differential between the hot and cold junctions. The voltage is approximately proportional to the temperature difference. The electric current multiplied by the voltage gives the available power provided by the thermoelectric device 203.

The ideal efficiency with which such a device converts thermal energy to electrical energy is given by well-known formulas that show dependencies on the temperature difference between the hot and cold junctions, the geometry, and the properties of the materials making up the p and n-legs. The efficiency, η, is given by:

$$\eta = \left(\frac{T_h - T_c}{T_h}\right)\left(\frac{M - 1}{M + \frac{T_c}{T_H}}\right) \quad (1)$$

Where $T_H$ is the hot junction temperature, $T_C$ is the cold junction temperature and M is given by the formula:

$$M = \sqrt{1 + ZT} \quad (2)$$

wherein ZT is a dimensionless material property known as the thermoelectric figure of merit. Z is given by $$Z = \frac{\sigma S^2}{\kappa} \quad (3)$$

where σ is the electrical resistivity, κ is the thermal resistivity, and S is the Seebeck coefficient. T is an average temperature. The formulas present here are simplified by treating ZT as a constant. A more detailed formulation would need to account for the temperature dependent variation of ZT through each of the legs 219 and 220, and the fact that the semiconductor material is not the same for each leg, or necessarily within each leg. This should not detract from the points made below.

The first term in equation (1) is the Carnot efficiency. The Carnot efficiency is a consequence of entropy and cannot be avoided by any type of device for converting thermal energy to electrical energy. The second term in Equation (1) shows the separation between a thermoelectric device and an ideal device. The major dependence of this term is the dependence on ZT, with higher values being better. Until recently, the best values of ZT were about 1.0 and limited the efficiency of thermoelectric devices to about 20% of the Carnot efficiency.

Figure 4:
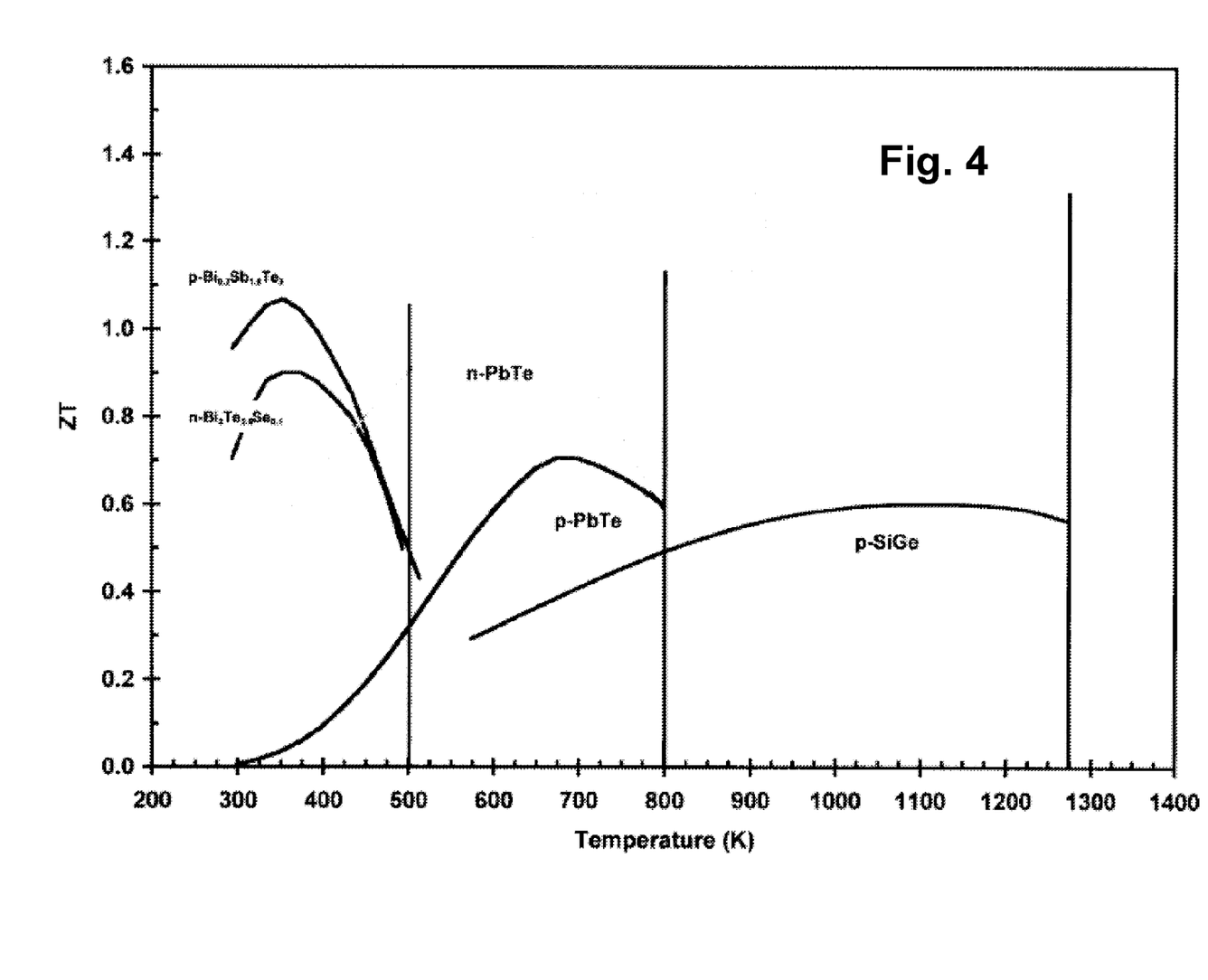
FIG. 4 is a plot showing the thermoelectric figures of merit as a function of temperature for several semi-conductor material

FIG. 4 shows the figures of merit of several semiconductor materials over a range of temperatures. It can be seen from this figure that different semi-conductor materials are effective over different temperature ranges. This complicated the selection of semiconductor materials, because the thermoelectric device 103 is intended to operate with the temperature gradient running through the legs 219 and 220: the temperature is expected to vary greatly over the lengths of the legs. High temperatures will occur at the tops legs 219 and 220 and low temperatures at the bottoms. A material that would provide a good figure of merit may give poor performance at the bottom and vice versa.

FIG. 3 illustrates the preferred solution and a preferred selection of materials. The solution is to make each of the legs 219 and 220 from a plurality of segments, each segment corresponding to a different semiconductor material. The lower segments 219c and 220c, are selected to have high figures of merit at lower temperatures, and the upper segments 219a and 220a are selected to have high figures of merit at high temperatures.

Figure 5:
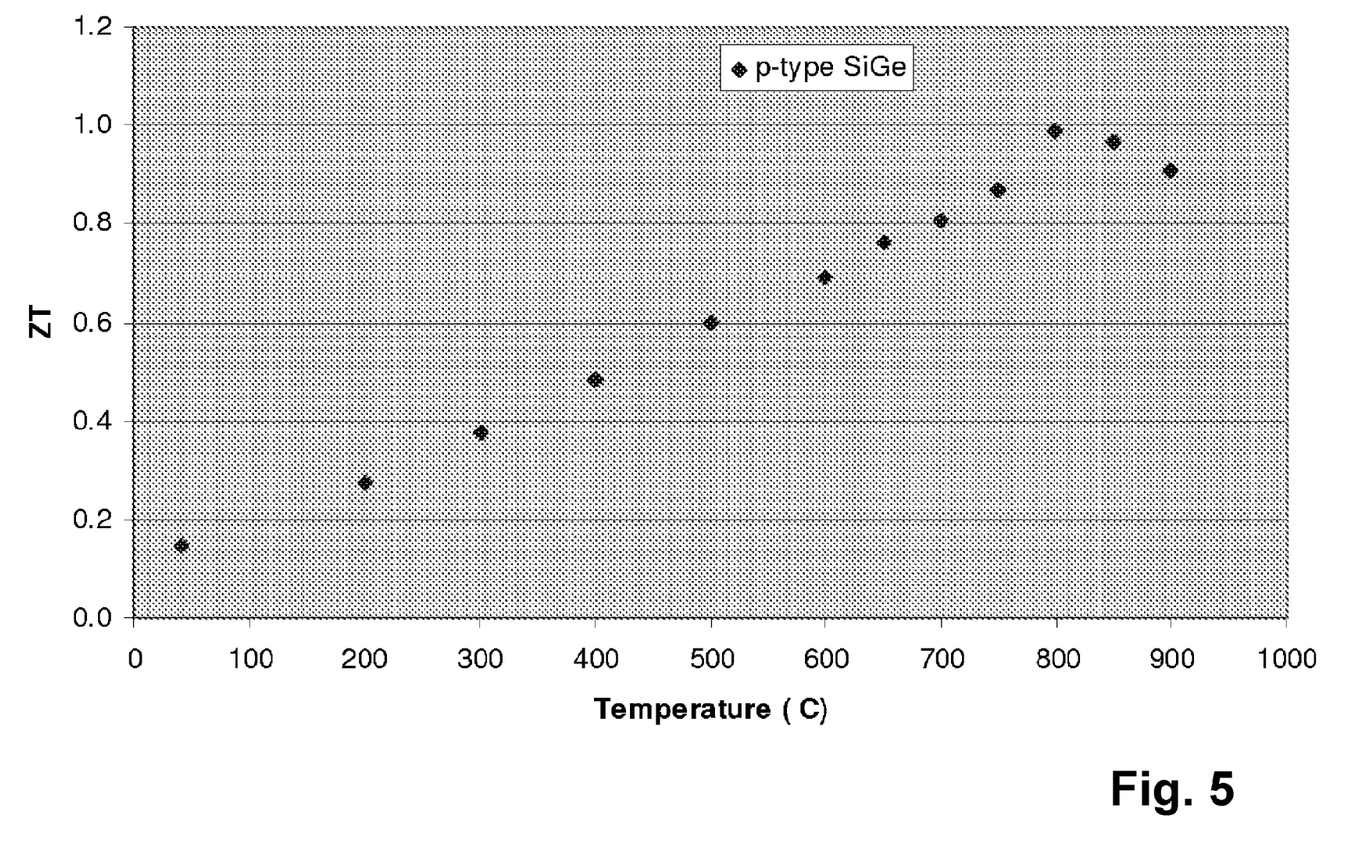
FIG. 5 is a plot showing the thermoelectric figures of merit of an p-Si/p-SiGe nano-composite.

The figures of merit of many semiconductor materials, including those shown in FIG. 4, can be improved greatly by introducing quantum confinement of carriers. The main effect of such quantum confinement is a substantial reduction in thermal conductivity. The figure of merit can be nearly doubled in many cases. FIG. 5 provides an exemplary result for comparison with FIG. 4. Quantum confinement is provided by nano-scale structures formed in the semiconductor matrix. For the compiste of FIG. 5, the nanostructures are particles of p-SiGe crystal in of mixed sizes in the range from 1-200 nm. Nano-scale structure include quantum wells, quantum wires, and quantum dots. Quantum dots provide the most benefit. These nano-scale structures are composite structures: the dots are small crystals of a second, suitably selected, semiconductor material formed in the matrix of another semiconductor. Suitable materials for the nanostructure can be found for each of the matrix materials. Some additional examples include $Bi_{0.3}Sb_{1.7}Te_{0.3}$ for a One technique for forming the quantum dots is to alternate between depositing a few layers of the matrix materials and depositing a few layers comprising the matrix material together with wells of the second material. Details of suitable techniques are in the public domain. The materials and methods that have been described by workers at the Massachusetts Institute of Technology (MIT) are recommended. Those not familiar with these materials and methods can find them described in various publications including U.S. Pat. No. 6,444,896 and U.S. Pat. Pub. Nos. 2006/0118158, 2008/0202575, 2009/0068465. Those patents and patent publications are incorporated herein by reference in their entirety.

Parameters that can be tuned in order to improve the result include thickness of the quantum well structures, their interspacing, and the atomic proportions of the alloys. Segmentation as shown in FIG. 3 remains desirable for the nanocomposites, although it will be noted that the composites have their peak ZT values in temperature ranges shifted from those for the source materials. Adjusting the composition of the nanostructure alloy is one way to shift the temperatures at which high ZT values occur.

Two parameters are available for balancing the heat flux and energy production of the legs 219 and 220. One type of leg can be made wider than the other; width being meant in the sense of greater cross-sectional area. The other mode of adjustment is to place a pedestal under one or the other leg so that one leg can be shorter than the other. A pedestal is a leg segment made of a thermally conductive material such as a metal.

The structure of the solar powered generator 100 determines the magnitude of the temperature gradients that will develop across the thermoelectric device 103. The main factors that determine that gradient are the solar concentration factor, f, and the thermal resistivity of the thermoelectric generator 103. That thermal resistivity can be tuned by adjusting the height of the legs 219 and 220.

The solar concentration f, together with the intensity of the sun's radiation determine the required heat flux. The entire sun's spectrum to the extent practical will be concentrated and focused on the surface of the solar panel 102. While some of the energy will be converted to electricity, the great majority, typically 90% to 95%, will become thermal energy. The configuration is for all the heat to go in one direction, downward, perpendicular to the surfaces of the solar panel 102. The thermoelectric device 103 is conformal with the solar panel 102. The energy flux density through the thermoelectric device 103 is nearly the same as that through the bottom surface of the solar panel 102.

The maximum in the heat flux rate through the thermoelectric device 103 is given by the peak intensity of the sun's radiation on the Earth's surface, about 1.3 kW/m, multiplied by solar concentration factor, f. Corrections can be made for energy conversion to electricity by the solar panel 102 and parasitic (unintended) heat losses, but the result is still roughly the amount of heat flux per unit area that the thermoelectric device 103 must be designed to transport.

An important design choice to consider at this point is the target for the temperature differential, ΔT, between the hot junction 207 and the cold junction 208. Larger temperature differential lead to more efficient thermoelectric energy production, lower temperature differentials lead to a cooler solar panel 102, and more photovoltaic energy production.

The preference here is to choose a large ΔT to get into the range where thermoelectric conversion efficiency is high, and the sensitivity of the total energy production to the cold junction temperature is low. Preferably, ΔT is at least 200° C., more preferably at least 300° C. Higher values such as 500° C. and 600° C. can be desirable in that ΔT remains high even when the light level has dropped well below its peak. The main disadvantage of going to higher and higher temperature differentials is that peak temperatures are increased and materials begin to deteriorate and eventually fail.

The approximate leg height, h, to achieve a target temperature differential, ΔT, can be calculated as follows:

$$h = \Delta T \Big/ \left( f * \kappa * 1.3 \frac{kW}{m} \right) \tag{4}$$

where κ is a suitably calculated average thermal resistivity for the legs 219 and 220. From this formula, it can be seen that high thermal resistivity allows the legs to be shorter. A high solar concentration factor f greatly reduces the required height of the legs. Materials costs can be a significant contribution to the total cost of this system, and reducing the required amount of semiconductor material is very advantageous. Equation (4) shows that a solar concentration factor of 100 reduces the required thickness for the semiconductor material in the thermoelectric device 103 by a factor of 100. This is compounded with the gain of processing 100 times as much sunlight per unit area. The total reduction in the thermoelectric material requirement is approximately f squared, 10,000 in this example. Solar concentration makes feasible the use of materials that would otherwise be too expensive. For this reason, low solar concentration is preferred over no solar concentration, moderate solar concentration is more preferred, and high solar concentration is still more preferred. Another advantage of solar concentration is that it facilitates reaching the target temperatures differential quickly; it has an effect similar to making the heat capacities less.

Preferably, all the heat going from the hot junction 207 to the cold junction 208 travels through the legs 219 and 220. Any heat traveling through the insulation 222 does not contribute to thermoelectric energy generation. The materials of legs 219 and 220 are themselves generally good insulators, even if they are just ordinary semiconductors. When they are made into nano-composites they become even better insulators: nano-structures improve the thermoelectric figure of merit by increasing the thermal resistivity more than the thermal conductivity of the composite material. There are only a few types of materials that are substantially better insulators. In particular, substantially better insulators are air, vacuum, and aerogels. Here, "vacuum" is encompassed within the term "insulating materials".

The thermoelectric device 103 is conformal with the solar panel 102 in order that it drains heat uniformly from the back 106. This dictates the cross-sectional area for the device 103. The thermal resistivity offered by the thermoelectric device 103 is also constrained. If the thermal resistivity is too low, the desired temperature difference will not develop. If the thermal resistivity is too high, the solar panel 102 will heat excessively.

Figure 2:
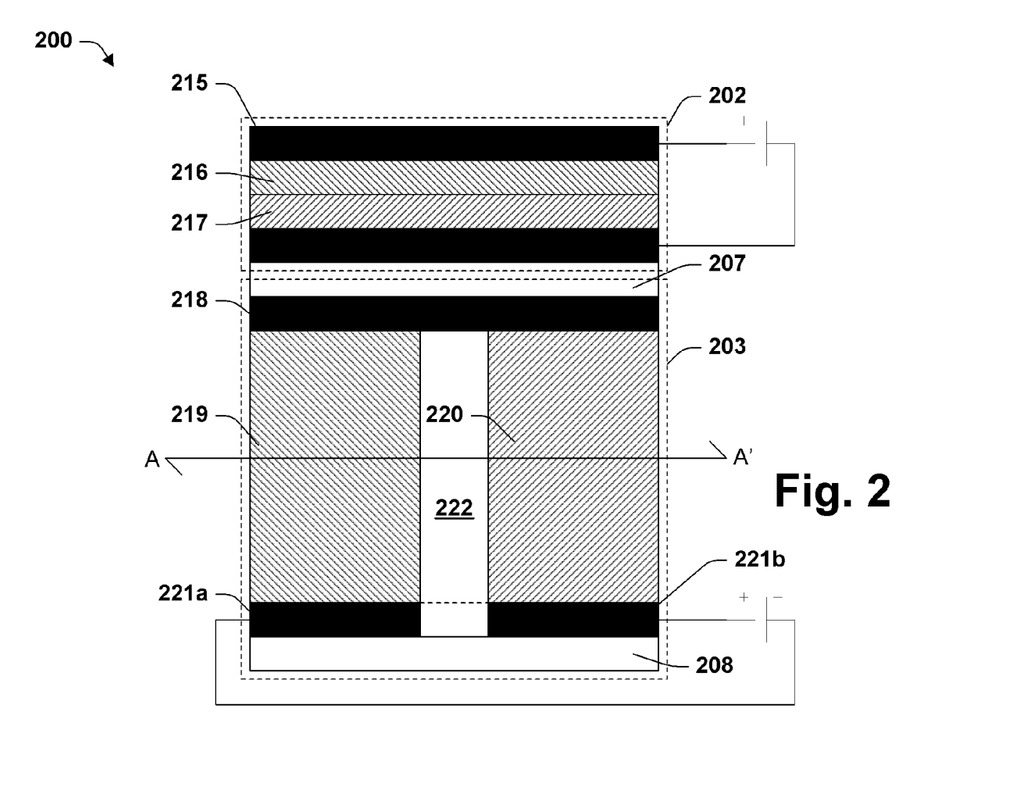
FIG. 2 is a schematic illustration of an exemplary solar panel and thermoelectric device of integral construction.
Figure 7:
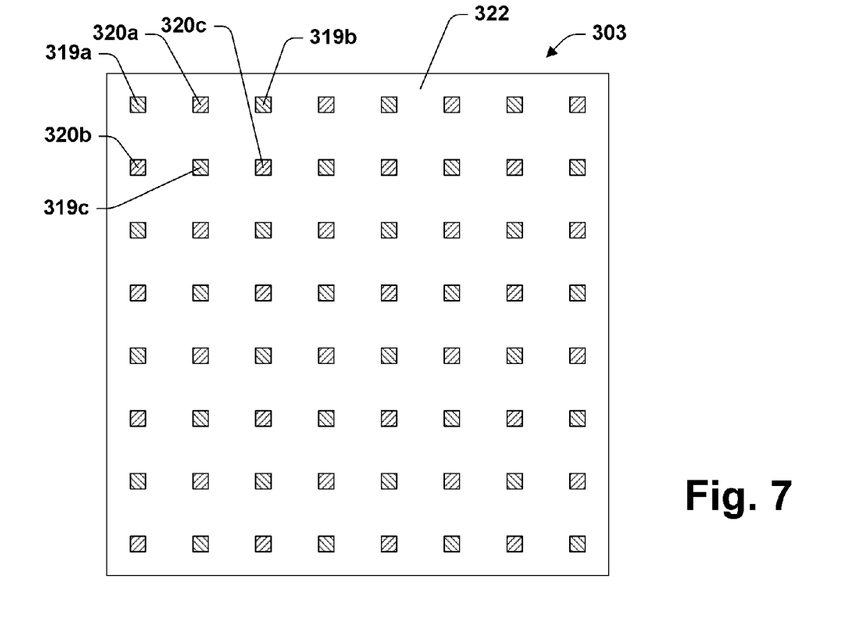
FIG. 7 corresponds to a cross-section through line A-A' of FIG. 2, and illustrates the legs of a thermoelectric device widely, evenly, and finely distributed in a highly thermally insulating matrix.

A concept for reducing the amount of semiconductor material required for the thermoelectric device 10 and indeed for any thermoelectric device that is designed to provide a predetermined heat flux per unit area with a predetermined temperature gradient, is illustrated by FIG. 7, which corresponds to a cross-section of the thermoelectric device 203 through the plane of line A-A' of FIG. 2.

According to this concept, a majority of the cross-sectional area (at least 50%), and volume, preferably at least 90%, is filled with a highly effective insulating material, preferably a material selected from the group consisting of vacuum, air, aerogel. This reduces the area available for heat conduction through the legs 219 and 220 to a minority of the area (less than 50%), preferably less than 10%. If the cross-sectional area of the legs 219 and 220 is reduced by 50%, the thermal resistivity between the hot junction 207 and cold junction 208 is approximately doubled. To maintain the design temperature differential and heat flux the heights of the legs, h, are halved. The adjustment is applied to each segment if multiple segments are used. Halving the cross-sectional area and halving the height, h, reduces the amount of material required by 75%. Reducing the cross-sectional area by 90% and reducing the height by 90% reduces the amount of required thermoelectric semiconductor material by a factor of 100. This is a particularly important advantage if expensive materials are used.

In order to prevent excessive temperature gradients from developing around the hot junction 207, the legs 219 and 220 are evenly and closely spaced through the matrix of insulation 222 throughout the entire area of the thermo-electric device 203. Close spacing can be maintained while reducing the fraction of the area occupied by the legs 219 and 220 by increasing the number of legs as their sizes are reduced. It should be appreciated that there are innumerable ways to meet these geometric constraints. For example, the legs 219 and 220 can have cross-sections that are elongated like wires.

As the percentage of area occupied by the insulation 222 becomes greater, heat loss through the insulation becomes more significant and will eventually outweigh the benefit of further reduction in semiconductor area and material usage. Limitations on material processing can also pose a limit, as well as changing electrical properties with dimensions, including the properties that change unintentionally as attempts are made to shape progressively smaller structures. Nevertheless, the structure illustrated by FIG. 7 is an enabler to the use of nano-well composites that are made by process comprising separate steps for depositing each of many nanometers thick layers. Being able to use shorter legs 219 and 220 reduces the required number of process steps.

A heat sink 104 can be anything that is functional to continuously draw heat from the cold junction 108 at such a rate that the solar powered generator 100 can arrive at steady state operation under continuous full sun. The heat sink 104 can comprise a fixed body of material, a body of water for example, or comprise a heat exchanger that transfers heat from the cold junction 108 to an essentially inexhaustible flow, as in the case of a heat exchanger with fins and a steady stream of air. While the solar generator 100 is not limited with respect to the type of heat sink 104, it has particular utility for a certain class of heat sink.

One such class of heat sink is a partially closed system of such limited capacity to take up heat that under continuous full sun the heat sink 104 is warmed significantly by the solar powered generator 100. Significance in this context means a substantial change in the consequent temperatures within the solar generator 100. For example, a significant change would cause the cold junction 108 to become at least 40° C. hotter, and a more significant change would cause the cold junction 108 to become at least 100° C. hotter. Such changes will affect steady state temperatures throughout the solar powered generator 100. Any change in the temperature of the heat sink 104 that causes the temperature of the solar panel 102 to rise by 40° C. or more is significant because of the reduction in efficiency that this would cause if ordinary solar panel materials were used. In this regard a change of 100° C. would be very significant.

When the capacity of the heat sink 104 is so limited that temperature changes of these magnitudes are routine, the solar powered generator 100 can provide a valuable improvement in comparison to a conventional solar thermal cogeneration system, which would lack the thermoelectric device 103 or a design that encourages heating more than a few degrees above the desired hot water temperature. The solar powered generator 100 is designed for the thermoelectric device 103 to be the predominant mode of electric power generation. The generator 100 remains highly functional in the face of temperature changes that would undermine the efficiency of a conventional solar panel.

Accordingly, according to a method of the invention, the solar power generator 100 is connected to a heat sink 104 that is by its nature limited in effectiveness or variable in its temperature, whereby the solar powered generator 100 will operate with the temperature of the cold junction 108 varying by 40 Kelvin or more, optionally 100 Kelvin or more. The method comprises developing a large temperature gradient across the thermoelectric device 103, whereby the thermoelectric device 103 is the predominant mode of electricity generation, producing more power than the solar panel 102. The large temperature gradient is brought about by exposing the solar panel 102 to sunlight light with a sufficiently high solar concentration factor, f. What constitutes a sufficiently high solar concentration factor depends on the thermal resistivity of the thermoelectric device 103, which is selected to allow the desired gradient to be generated with the solar concentration factor f that is provided by or achievable with the solar concentration system 101. The advantage of the method is that it provides power generation with an efficiency that has a low sensitivity to fluctuations in the heat sink performance and the cold junction temperature.

A heat sink 104 having limited capacity could be a domestic hot water system, depending on the amount of water it contains in relation to the capacity of the generator 100. If the solar powered generator is merely a supplemental heating system whereby the hot water remains at an essentially constant temperature, the heat sink 104 will be efficient and an ordinary solar thermal generator would most likely better serve. On the other hand, if the hot water temperature varies between 50° C. and 95° C., or 25° C. and 95° C., in the necessary course of its functioning as the heat sink, than it is a heat sink of limited capacity.

Other types of heat sinks that may motivate the use of the solar generator 100 include those that vary widely in temperature of their own accord, either in terms of heat sink temperature or heat transfer coefficient. For example the heat sink 104 could be a cooling system of a vehicle. When the vehicle's engine is stopped the solar generator 100 can serve to keep the coolant, providing easy starts on cold days and reducing cold start emissions. Another potential use would be cabin heating while the engine is not running, and thereby avoiding the need to idle the engine. If enough cooling can be provided to prevent overheating, by running the engine fan of example, an air conditioner can be powered with the engine off.

When the vehicle is running, the solar generator 100 can provide auxiliary power and thus improve the vehicle's efficiency. If there is a danger of overheating, running an engine fan may be enough. These uses make do with a heat sink that is highly variable and can exceed 100° C. in temperature. The solar powered generator 100 will typically operate efficiently with a heat sink in the temperature range from 100° C. to 200° C.

To prevent overheating, means can be provided to slow or shut down the solar powered generator 100. A solar tracker would be a suitable means, if one is used. A tracking system can orient the collector away from the sun if that becomes desirable to prevent overheating. If the solar concentration system 101 provides a controllable solar concentration factor, f, that factor can be reduced. In general, however, it is preferred that the solar concentration system 101 provide as much light to the solar panel 102 as it is capable of providing.

Another application that can involve a vehicle uses airflow for cooling. In this example, the heat sink 104 is a heat exchanger that transfers heat from the cold junction 108 to the ambient. Such a heat sink may have a highly variable performance that depends on ambient temperature and whether the vehicle is moving or stopped.

Depending on the relative sizes of the solar generator 100 and the heat sink 104, the heat sink 104 may be inadequate to maintain a sufficiently constant temperature to maintain a conventional solar panel in an efficient mode of operation. The solar powered generator 100 can make do with much less cooling as compared to a similar device using just a solar panel. The solar powered generator 100 can be designed to operate efficiently over a broad range of heat sink temperatures. Designing for a high temperature gradient through the thermoelectric device 103 shifts power generation to the thermoelectric device 103 and reduces reliance on the solar panel 102.

The effective functioning of the solar panel 102 can be limited to warm-up periods during which the thermoelectric device 103 has not developed the temperature gradient it requires to operate efficiently. The solar powered generator 100 could be used to drive a vehicle or as part of a hybrid drive system. In such a system, it is advantageous to have electric power as soon as the sun comes out.

The thermoelectric generator 103 produces its current at a voltage that varies with the temperature difference between hot junction 107 and the cold junction 108. The solar powered generator 100 receives varying amounts of light over the course of any given day, whereby the heat flux, temperature gradient and resulting voltage will necessarily vary substantially. Therefore, it is preferred that the solar powered generator 100 be provided with an electrical system including a voltage regulator for drawing the current from the thermoelectric device 103 at the voltage it is supplied and outputting that current at a constant voltage.

The solar panel 102 provides power separately from the thermoelectric generator 103. It will generally be desired to combine the output from the solar panel 102 with that of the solar generator 103 in order to form a single source. This is accomplished by providing the solar powered generator 100 with electrical components for combining and matching the voltages from these two sources.

Optionally the solar powered generator 100 includes an electrical energy storage system. This energy storage system may comprise batteries and/or capacitors. Another option that may be useful is a standard coupling for plugging in to the solar powered generator 100. A transformer may also be included to convert the direct current into an alternating current with a standard frequency and voltage.

When the solar powered generator 100 is operating, the solar concentration system 101 concentrates sunlight 109 onto the surface 105 of the solar panel 102. The solar panel 102 absorbs most of this sunlight (radiation) and from it produces electrical energy with an efficiency that diminishes with increasing temperature. Most of the absorbed radiation is converted to thermal energy.

The bottom surface 106 of the solar panel 102 abuts the thermoelectric device 103. The thermoelectric device 103 comprises hot junction 107 and cold junction 108. The hot junction 107 is proximate to and in close thermal contact with the bottom surface 106 of the solar panel 102. In this arrangement the thermoelectric device 103 provides the primary pathway for which the solar panel 102 gives up its heat. If necessary, the solar panel 102 can be contained within an enclosed and/or insulated space to reduce other pathways of heat loss. By eliminating or reducing other pathways of heat dissipation, the vast majority of the thermal energy absorbed by the solar panel 102 can be directed through the thermoelectric device 103, whereby it can be used for electrical power production.

Some of the incident radiation will be reflected from the solar panel 102. In addition, the solar panel 102 will release energy through radiation. Reflectors may be positioned to redirect this emitted and reflected light to re-reflect the light back upon the surface 105. These reflectors may comprise a mirror chamber substantially a space over the surface 105. Such reflectors can provide a significant increase in efficiency.

Heat from the hot junction 107 flows to the cold junction 108. A portion of the thermal energy transported in this way is converted to electricity by the thermoelectric device 103. Thus the solar powered generator 100 generates electricity in at least two places. The electrical power from these sources can be transformed and combined in order to provide a unitary power supply at a constant voltage using electronic parts separate from or integrated into the solar powered generator 100.

Heat sink 104 draws heat away from the cold junction 108. The heat sink 104 may be highly efficient and maintain the cold junction 108 at an essentially constant temperature regardless of the intensity of the sunlight 109. Alternatively, the heat sink 104 may be inefficient whereby the temperature of the cold junction 108 varies. The temperature of the hot junction 107 varies correspondingly, as the temperature differential is determined by the heat flux rate, which is substantially independent of the cold junction temperature. When the cold junction temperature rises, the hot junction temperature rise to match. The hot junction temperature rises until the heat input to the solar cell 102 matches the heat output to the hot junction 108. This matching occurs at approximately the same temperature differential regardless of the cold junction temperature. Thus, an increase in the cold junction temperature soon leads to approximately equal increases in the temperatures of the hot junction 107 and the solar panel 102.

Figure 6:
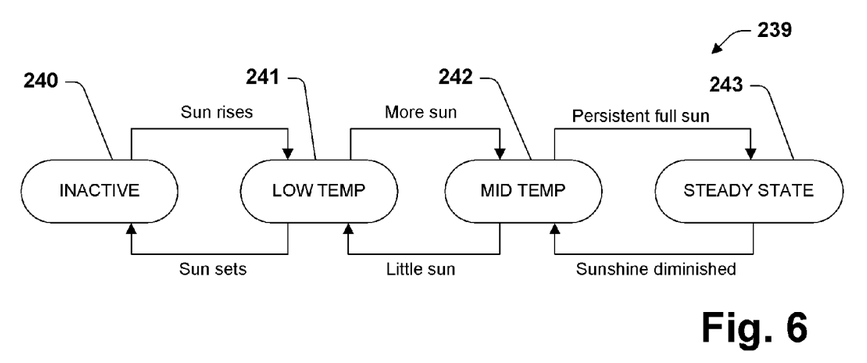
FIG. 6 provides a finite state machine diagram of the solar powered generator 100 operating in a preferred manner.

The performance of solar powered generator 100 is illustrated by the finite state machine diagram 239 of FIG. 6. The generator 100 begins in the inactive state 240. In the inactive state 240, all of the components of the solar powered generator 100 are near ambient temperature. In this regard, it should be appreciated that the main focus of the present application is devices for use in terrestrial applications. The inactive state 240 is typical for nighttime.

The main event that causes a departure from the inactive state 240 is the sun rising. This event moves the device 100 to the low-temperature operating state 241. In the low-temperature operating state 241, the solar panel 102 is producing power near its peak efficiency, while the thermoelectric device 103 provides little or no power.

While light levels remain low, the generator 100 remains in the low-temperature operating state 241. When light levels increase, the generator 100 immediately begins to produce more power. The increased light levels quickly warm the solar panel 102 and the generator 100 transitions to the middle temperature operating state 242. Power production by the thermoelectric device 103 will generally surpass power production by the solar cell 102 as the generator 100 warms to state 242.

As the solar panel 102 warms, the temperature gradient across the thermoelectric device 103 increases. The efficiency of the solar panel 102 decreases while power production by the thermoelectric device 103 increases. Preferably, in the middle temperature operating state 242, as temperatures fluctuate, efficiency losses to the solar panel 102 are balanced by efficiency gains by the thermoelectric device 103, and visa-a-versa, whereby efficiency remains in a narrow range even as light and power levels fluctuate. Optionally, however, the efficiency of the solar panel 102 drops during this period to a range in which power production by the solar panel 102 is very low in comparison to power production by the thermoelectric device 103, and the overall efficiency is substantially that of the thermoelectric device 103, which by and large increases monotonically with temperature.

With persistent full sunshine, the solar powered generator 100 reaches the high temperature steady-state 243. The temperature of the solar panel 102 is about its designed maximum, although the temperature of the solar panel 102 also depends on that of the heat sink 104, which can vary. The temperature gradient through the thermoelectric device 103 is also at approximately the designed maximum, depending on such factors as the season and time of day. Light input is near its maximum and efficiency of the thermoelectric device 103 is near its peak. The efficiency of the solar panel 102 is diminished to a degree that is either moderate or very great, depending on whether the solar panel 102 is adapted for high temperature operation. Even with the solar panel 102 adapted for high temperature operation, it would is typical for the thermoelectric device 103 to produce 2, 3, or 4 times as much power as the solar panel 102.

Efficiency as well as power production in the solar powered generator 100 are typically highest in the high temperature steady state 243. Materials considerations are likely to be the factor militating against designing for even higher temperatures and temperature gradients and thereby accessing higher levels of efficiency.

A rapid transition to the high temperature steady state 243 when full sun becomes available will generally provide greater efficiency. This transition is slowed according to the thermal mass of the solar panel 102 and any materials used to make contact between the solar panel 102 and the thermoelectric device 103. Where the panel 102 and the thermoelectric device 103 are manufactured separately, solder or thermal paste may be used to ensure a good contact. A small air gap at the interface could cause the temperature of the solar panel 102 to rise significantly above that of the hot junction 107, which would reduce the performance of the solar panel 102 without providing any benefit to the thermoelectric device 103. A more severe breakdown in contact could quickly result in a damaging temperature excursion, particularly if solar concentration factors. Such a breakdown could be caused by a deformation of one of the contact surfaces, which might itself be the result of temperature cycling.

A concept that solves several of these problems is provided by a solar panel 202 and a thermoelectric device 203 having a unitary construction. In such a construction, the solar panel 202 and the thermoelectric device 203 are layers in a composite structure similar to an integrated circuit. The layers are formed one over the other through a sequence of process steps. Processes of masking, etching, and deposition may be combined in various ways to produce the desired result. Most of the steps are, or can be, the same as those normally used to form the devices 102 and 103 individually, particularly with regard to the case where the solar panel 102 is a thin film solar cell and the thermoelectric device 103 comprises nano-composite segments formed through many separate layer deposition steps.

The process of making the integrated device 200 may begin from the bottom up or the top down. Starting from a point where the thermoelectric device 203 is formed, the principle modification is to ensure the interconnect layer 207 is planar and to deposit a semiconductor substrate layer over the interconnect layer in such a way that the substrate does not easily delaminate. One approach is to deposit a metal layer over the interconnect layer 207. Forming a GaP solar cell over such a metal layer is a conventional process.

Alternatively, the solar cell can be formed first. One option is to use a temporary substrate, Ge for example, as a structure on which to build the solar cell. All or just the bottom layers of the solar cell 202 are formed on the Ge substrate. Then the layers comprising the thermoelectric device 203 are built. Finally, the temporary substrate is removed, and if necessary, the solar cell 202 given additional processing to become completed.

The integral construction provides a variety of advantages, including higher thermoelectric efficiency due to less thermal mass, excellent thermal contact between the solar panel 203 and the hot junction 207, and a better ability to with stand thermal cycling through a reduction in the number of layers, and the avoidance of thick layers.

Figure 8:
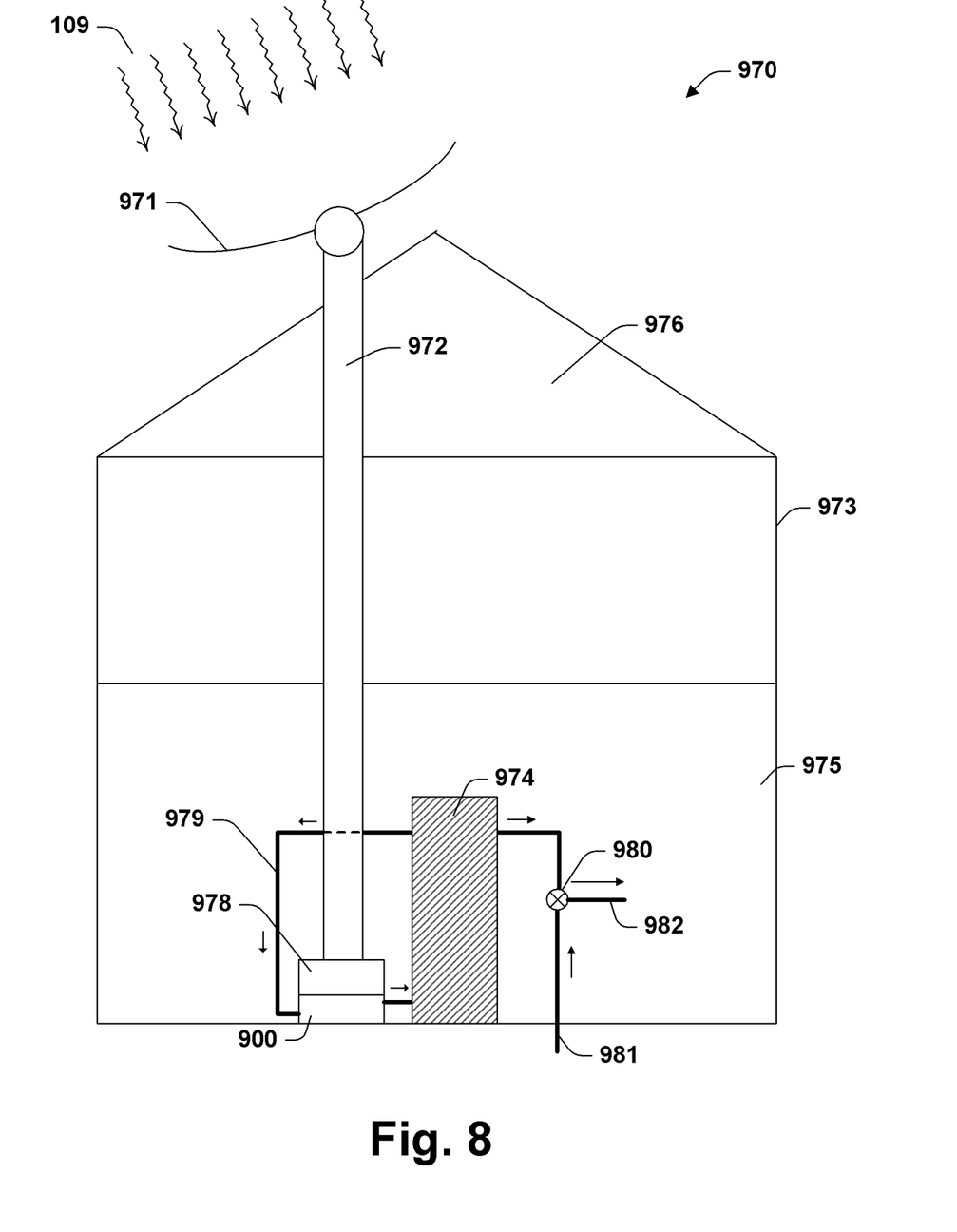
FIG. 8 illustrates an exemplary domestic hot water heating and power generation system employing concepts from each of the foregoing figures.

An example application for the solar powered generator is the system 900, which is a combined system for domestic solar hot water heating with cogeneration of electricity. The system 970 includes the solar collector 971, which is designed for rooftop installation. The collector 971 gathers solar energy 109 and transmits it via the fiber optic cable 972 to the solar powered generator 900. The size of the collector 971 is chosen in relation to the amount energy that an ordinary household will use for hot water heating. A size in the range from about 1 to 10 square meters could be suitable, typically in the range from about 2 to about 6 square meter.

The solar powered generator 900 is located inside a building 973, preferably next to the water tank 974. Water tanks are usually in a basement 975 and it is preferable to avoid the energy waste of circulating hot water through long pipes. An location in attic 976 may be preferable for ease of installation. A suitable size for the tank 974 would be in the range from 100 to 1000 liters, more typically in the range from about 200 to about 600 liters.

The fiber optic bundle 972 shines light onto the surface of the solar panel of the solar powered generator 900, preferably with a high degree of solar concentration. An intensity in the range from 50 to 250 suns would be preferred. At 100 suns, the solar panel would be in the range from 100 to 1000 cm². A mirror chamber comprising mirrors on the inside and surrounded by vacuum insulated double-pane glass, traps heat and light rising off the solar panel. At steady state operation with full sun, the solar panel develops its maximum designed temperature gradient, which is 350 Kelvin.

The heat from the solar panel is transmitted by a thermal-electric generator to the heat exchanger 978. The heat exchanger 978 forms part of a loop 979 through which water re-circulates between the tank 974 and the heat exchanger 978. By placing the solar powered generator 900 near the base of the tank the re-circulating flow can be powered thermogravimetrically. Alternatively, an electric pump could be used.

The hot water system comprising the heat exchanger 978, the loop 979 and the tank 974 provide the heat sink that is a closed system with a limited capacity to absorb heat. Fluctuations in user demand are accommodated in part by allowing the water temperature to vary through a wide range. A back-up gas heater may bottom the generator 900 to provide a minimum temperature of 50° C. The water can then be allowed to heat to 95° C. before taking any measures to release the excess heat. A mixing valve 980 is configured to automatically adjust a mixing ratio between water from the tank 974 and a cold water supply 981 to provide water on demand at a preset temperature. If the hot water temperature reaches its allowed maximum, heat can be surrendered by dumping hot water or defocusing the solar collector 971. As the heat sink cycles from 50° C. to 95° C., the solar panel is expected to cycle from 400° C. to 445° C. This cycling is not expected to affect electrical power production.

Using a single junction thin film GaP solar cell, and conventional thermoelectric materials, power generation from the solar panel at room temperature would be about 10%. As the device 900 increases to its operating temperature, the solar panel production efficiency diminishes to about 7%. Generation from the thermoelectric device increases with temperature. If conventional thermoelectric semiconductors with 0.8 ZT are employed, the thermoelectric device efficiency is expected to reach about 9% at steady state, giving a total efficiency of 16%. If nano-composite materials are used to provide 2.0 ZT, the efficiency of the thermoelectric device alone is 16% and the total efficiency is 25%. If the solar panel temperature drops 100° C., the overall efficiency only drops to 23%. Power would drop more because the temperature drop is caused by diminished light. The efficiency drops off more rapidly at lower temperatures, but remains high over a substantial range of light levels and water tank temperatures. The high temperature differential design, The adaptation of the solar panel to high temperature performance, and the efficient use of semiconductors that enable the use of high ZT materials combine to provide a system that is economical and efficient.

INDUSTRIAL APPLICABILITY

The present invention is useful for green energy production.

The invention claimed is:
1. A solar powered generator comprising:
a solar panel having a top side and a bottom side and being functional to generate electric power from sunlight;
a thermoelectric device adjacent to and below the solar panel, the thermoelectric device comprising a hot junction and a cold junction, the hot junction being in close thermal coupling with the bottom side of the solar panel, the thermoelectric device being functional to generate electric power when the hot junction is hotter than the cold junction; and
one or more electrical connections for electrically coupling to and drawing electrical power from the solar panel and for electrically coupling to and drawing electrical power from the thermoelectric device; and
a solar concentration system configured to concentrate sunlight onto the top of the solar panel, the system having a maximum solar concentration factor, f;
wherein the thermoelectric device comprises n-type legs configured to conduct heat from the hot junction to the cold junction and p-type legs configured to conduct heat from the hot junction to the cold junction, the n-type and p-type legs having a height and the thermoelectric device having an average thermal resistivity through the height of the n-type and p-type legs;
the n-type legs comprise one or more segments of n-doped semi-conductor materials;
the p-type legs comprise one or more segments of p-doped semi-conductor materials;
at least one of the segments is formed of a nano-composite material in which quantum confinement of carriers substantially reduces the segment's thermal conductivity; and
the height of the legs, the solar concentration factor of the solar concentration system, and the average thermal resistivity of the n-type and p-type legs are independently selected such that sunlight incident on the solar concentration system with an intensity of 1.3 kW/m2 is operative to heat the solar panel to temperatures in excess of 575 K with the ambient temperature at 300 K while the cold junction is maintained at or below a temperature of 100 C.

2. The solar powered generator of claim 1, wherein f is 100 or more.

3. The solar powered generator of claim 1, wherein:
the solar panel comprises a solar cell of the single or dual junction type;
the junctions that determine the solar cell type are either homojunctions formed of first semiconductors or heterojunctions comprising absorber layers formed of first semiconductors and window layers formed of second semiconductors;
wherein if the solar cell is of the single junction type the first semiconductor of the junction has a band-gap energy greater than 1.8 eV; and
if the solar cell is of the dual junction type, the first semiconductor of the uppermost junction has a band-gap energy greater than 2.0 eV.

4. The solar powered generator of claim 1, wherein the height of the legs in relation to the solar concentration factor and the average thermal resistivity is great enough that sunlight incident on the solar concentration system with an intensity of 1.3 kW/m² is operative to heat the solar panel to temperatures in excess of 675 K when the solar powered generator is operated with an ambient temperature of 300 Kelvin and with the cold junction maintained at a temperature below 100° C.

5. The solar powered generator of claim 1, further comprising:
a heat sink in contact with the cold junction;
wherein the structure of the solar power generator makes sunlight incident on the solar concentration system with an intensity of 1.3 kW/m² operative to heat the solar panel heats to a temperature at which the thermoelectric device produces at least twice as much power as the solar panel when the ambient temperature is 300 Kelvin.

6. The solar powered generator of claim 1 wherein at least one of the n-type and p-type legs comprises two segments of differing composition, each composition having an operating temperature range in which its thermoelectric figure of merit is superior to that of the other.

7. The solar powered generator of claim 1, further comprising:
a heat sink in contact with the cold junction;
wherein the heat sink comprises hot water pipes, a hot water tank, and a closed loop through which water re-circulates between the hot water tank and the cold junction.

8. The solar powered generator of claim 1, further comprising:
a solar collector; and
one or more optical fibers configured to transmit solar energy from the solar collector to the solar panel;
wherein the solar panel, the thermoelectric device, and the hot water tank are located within a residential or industrial building configured to utilize hot water from the tank.

9. The solar powered generator of claim 1, further comprising:
a water mixing system coupled to the hot water tank and a cold water supply;
wherein the mixing system is configured to draw water separately from the hot water tank and the cold water supply and to supply a mixture of water drawn from those sources; and
the mixing system is configured to automatically adjust a mixing ratio between water from the tank and water from the cold water supply as necessary to keep the water supplied by the mixing system below a preset maximum temperature.

10. The solar powered generator of claim 1, wherein wherein the concentration factor, f, is 10 or more, whereby the solar concentration system is operative to provide greater than 10 kilowatts per square meter of solar radiation to the solar panel when sunlight is incident on the solar concentration system with an intensity of 1.3 kW/m$^2$;
wherein the hot junction of the thermoelectric device is in close thermal coupling with the back side of the solar panel, whereby heat transport through the thermoelectric device is operatively the principal pathway for cooling the solar panel;
wherein the thermoelectric device has a heat transfer coefficient between its hot and cold junction less than (f/100) kilowatts per m$^2$ (solar panel area) per Kelvin at 300 Kelvin, whereby sunlight incident on the solar concentration system with an intensity of 1.3 kW/m$^2$ is operative to produce a solar panel at steady state temperature that is 100 Kelvin or more above the cold junction temperature.

11. The solar powered generator of claim 1, wherein f is 100 of more.

12. The solar powered generator of claim 1, wherein the solar panel and the thermoelectric device are of a unitary construction wherein either the solar panel comprises layers of semiconductor material grown on components of the thermoelectric device or the thermoelectric device comprises layers of semiconductor material grown on components of the solar panel.

13. The solar powered generator of claim 1, wherein:
the thermoelectric device has a cross-section parallel to the back of the solar panel with an area approximately equal to that of the back of the solar panel, the cross-section cutting through the legs of the thermoelectric device;
the legs occupy less than 10% of the area of the cross-section; and
greater than 90% of the cross-section is occupied by a highly thermally insulating composition selected from the group consisting of vacuum, gas, and an aerogel, the insulating composition filling space between the legs.

14. A solar powered generator, comprising:
a solar panel having a top side and a bottom side and being functional to generate electric power from sunlight;
a thermoelectric device adjacent to and below the solar panel, the thermoelectric device comprising a hot junction and a cold junction, the hot junction being in close thermal coupling with the bottom side of the solar panel, the thermoelectric device being functional to generate electric power when the hot junction is hotter than the cold junction; and
one or more electrical connections for electrically coupling to and drawing electrical power from the solar panel and for electrically coupling to and drawing electrical power from the thermoelectric device; a solar concentration system configured to concentrate sunlight onto the top of the solar panel, the system having a maximum concentration factor, f;
wherein the thermoelectric device comprises n-type legs configured to conduct heat from the hot junction to the cold junction and p-type legs configured to conduct heat from the hot junction to the cold junction, the n-type and p-type legs having a height and the thermoelectric device having an average thermal resistivity through the height of the n-type and p-type legs;
the n-type legs comprise one or more segments of n-doped semi-conductor materials;
the p-type legs comprise one or more segments of p-doped semi-conductor materials; and
the solar panel and the thermoelectric device are of a unitary construction wherein either the solar panel comprises layers of semiconductor material grown on components of the thermoelectric device or the thermoelectric device comprises layers of semiconductor material grown on components of the photovoltaic device the height of the legs, the solar concentration factor of the solar concentration system, and the average thermal resistivity of the n-type and p-type legs are independently selected such that sunlight incident on the solar concentration system with an intensity of 1.3 kW/m2 is operative to heat the solar panel to temperatures in excess of 575 K with the ambient temperature at 300 K while the cold junction is maintained at or below a temperature of 100 C.

15. A solar powered generator, comprising:
a solar panel having a top side and a bottom side and being functional to generate electric power from sunlight;
a thermoelectric device adjacent to and below the solar panel, the thermoelectric device comprising a hot junction and a cold junction, the hot junction being in close thermal coupling with the bottom side of the solar panel, the thermoelectric device being functional to generate electric power when the hot junction is hotter than the cold junction; and
one or more electrical connections for electrically coupling to and drawing electrical power from the solar panel and for electrically coupling to and drawing electrical power from the thermoelectric device; a solar concentration system configured to concentrate sunlight onto the top of the solar panel, the system having a maximum concentration factor, f;

wherein the thermoelectric device comprises n-type legs configured to conduct heat from the hot junction to the cold junction and p-type legs configured to conduct heat from the hot junction to the cold junction;

the n-type legs comprise one or more segments of n-doped semi-conductor materials;

the p-type legs comprise one or more segments of p-doped semi-conductor materials;

the thermoelectric device has a cross-section parallel to the back of the solar panel with an area approximately equal to that of the back of the solar panel, the cross-section cutting through the legs of the thermoelectric device;

the legs occupy less than 10% of the area of the cross-section;

greater than 90% of the cross-section is occupied by a highly thermally insulating composition selected from the group consisting of vacuum, gas, and an aerogel, the insulating composition filling space between the legs; and the solar panel comprises solar cells of the single or dual junction type;

the junctions that determine the solar cell type are either homojunctions formed of first semiconductors or heterojunctions comprising absorber layers formed of first semiconductors and window layers formed of second semiconductors;

wherein if the solar cells are of the single junction type the first semiconductors of the junctions have a band-gap energy greater than 1.8 eV; and if the solar cells are of the dual junction type, the first semiconductors of the uppermost junctions have a band-gap energy greater than 2.0 eV wherein sunlight incident on the solar concentration system with an intensity of 1.3 kW/m2 is operative to heat the solar panel to temperatures in excess of 575 K with the ambient temperature at 300 K while the cold junction is maintained at or below 100 C.

* * * * *